United States Patent
Bogdanski et al.

(10) Patent No.: US 7,285,962 B2
(45) Date of Patent: Oct. 23, 2007

(54) METHOD AND APPARATUS FOR EVALUATING SUSCEPTIBILITY TO COMMON MODE NOISE IN A COMPUTER SYSTEM

(75) Inventors: Joseph W. Bogdanski, Poughkeepsie, NY (US); King M. Chu, Wappingers Falls, NY (US); William M. Lorenz, Saugerties, NY (US); Tuan D. Ngo, Poughkeepsie, NY (US); Andrew Rybak, Hopewell Junction, NY (US); Kwok M. Soohoo, Lagrangeville, NY (US); Gerard V. Weber, Jr., Saugerties, NY (US); William T. Winkler, Pleasant Valley, NY (US)

(73) Assignee: International Business Machines Corporation, Armonk, NY (US)

(*) Notice: Subject to any disclaimer, the term of this patent is extended or adjusted under 35 U.S.C. 154(b) by 624 days.

(21) Appl. No.: 10/843,183

(22) Filed: May 11, 2004

(65) Prior Publication Data

US 2005/0257110 A1 Nov. 17, 2005

(51) Int. Cl.
G01R 27/02 (2006.01)
G01R 29/26 (2006.01)
G01R 23/16 (2006.01)
G01R 31/28 (2006.01)
G06F 11/00 (2006.01)

(52) U.S. Cl. .................... 324/603; 324/613; 324/628; 714/742

(58) Field of Classification Search ............... 714/724, 714/742; 324/603, 613, 628
See application file for complete search history.

(56) References Cited

U.S. PATENT DOCUMENTS

| | | | |
|---|---|---|---|
| 3,657,555 A | | 4/1972 | Hoffman .................... 307/108 |
| 4,023,098 A | * | 5/1977 | Roth ....................... 324/76.12 |
| 4,417,207 A | | 11/1983 | Sato ......................... 324/158 |
| 4,998,071 A | * | 3/1991 | Strid et al. ................. 324/613 |
| 5,191,294 A | * | 3/1993 | Grace et al. ............... 324/613 |
| 6,242,925 B1 | | 6/2001 | Schutten et al. ........... 324/627 |
| 6,396,286 B1 | | 5/2002 | Chu et al. .................. 324/603 |
| 6,466,029 B2 | * | 10/2002 | Stroth et al. ............... 324/509 |
| 6,549,019 B2 | | 4/2003 | Nielsen ..................... 324/628 |
| 7,098,670 B2 | * | 8/2006 | Cole ......................... 324/615 |

OTHER PUBLICATIONS

IBM Technical Disclosure Bulletin, Aug. 1994, vol. 37, No. 8, pp. 551-552 ElectroMagnetic Interfernce Conducted Noise Mode Analysis Simplified and Auto System.

* cited by examiner

*Primary Examiner*—James C. Kerveros
(74) *Attorney, Agent, or Firm*—Cantor Colburn LLP; Lily Neff

(57) ABSTRACT

A system for injecting noise signals onto power generated by a power source comprising: a voltage source; a device under test having a power input in operable communication with the noise introduction apparatus; and a noise introduction apparatus interposed between the power source and device under test in operable communication with the voltage source, the noise introduction apparatus comprising, a switching device configured to provide a low impedance conductive path when commanded, and a current limiting device in series with the switching device, the current limiting device configured to provide a low impedance conductivity for a selected current and a selected duration. The switching device and current limiting device cooperate to shunt the voltage source to the power input.

15 Claims, 5 Drawing Sheets

METHOD AND APPARATUS FOR EVALUATING SUSCEPTIBILITY TO COMMON MODE NOISE IN A COMPUTER SYSTEM

FIELD OF THE INVENTION

This invention is related to the susceptibility of electrical equipment to power line noise. More particularly, this invention relates to the testing for and correction of the susceptibility of a computer system to common mode noise on lines supplying power to the system

BACKGROUND OF THE INVENTION

Electrical power lines transmit electrical noise to equipment powered by the power lines. One category of such noise is common mode noise. Common mode noise is a common mode voltage (CMV) or voltage that is present on both leads of an analog/digital input with respect to a ground. Common mode voltage is distinguished from a normal mode voltage (NMV), in that a normal mode voltage is a voltage that exists between the two leads of an input. The most common source of common mode noise is the difference in potential between two physically remote grounds. In poorly grounded power systems for example, this potential difference can raise both the power and neutral power lines supplying the electrical equipment 110 up to about 30 volts above the power supply ground. Even in well grounded power systems, this voltage differential may be in the neighborhood of 1 to 2 volts.

While ground potential differences are the major source of common mode noise, they are not the only source. Among the other causes of common mode noise are improperly grounded signals from other equipment tied to the power lines and radio frequency signals from sources such as microwave induction heaters and motor control relays. All the described types of noise signals result in ground current which could disrupt the operation of the equipment powered by the power supply. For instance, a computer ground current can cause damage to the computer circuitry or loss of data due to power supply voltage perturbations when power on reset of the power supply occurs.

Proper design and testing in the laboratory usually eliminates most power source problems. However, laboratory testing may not always identify common mode noise conditions encountered in the field that result in operational problems or damage to computer equipment. The common mode noise conditions encountered in the field can be continual or intermittent noise signals. Furthermore, existing systems are not always able to produce sufficient energy to simulate significant CM or ground bounce such as may be experienced with larger sysplex computer systems. In any case, it would be desirable to be able to test for common mode failure conditions, particularly those failure conditions encountered in the field, to eliminate susceptibility to the noise.

Therefore, what is desired in the art is the ability to evaluate electrical equipment for common mode noise susceptibility simulating common-mode voltage conditions encountered in the field under laboratory conditions to diagnose power failures and modify the systems to overcome those failures.

BRIEF SUMMARY OF AN EXEMPLARY EMBODIMENT

Disclosed herein in an exemplary embodiment is a system for injecting noise signals onto power generated by a power source comprising: a voltage source; a device under test having a power input in operable communication with the noise introduction apparatus; and a noise introduction apparatus interposed between the power source and device under test in operable communication with the voltage source, the noise introduction apparatus comprising, a switching device configured to provide a low impedance conductive path when commanded, and a current limiting device in series with the switching device, the current limiting device configured to provide a low impedance conductivity for a selected current and a selected duration. The switching device and current limiting device cooperate to shunt the voltage source to the power input.

Also disclosed herein in an exemplary embodiment is a method for testing noise susceptibility of a device under test comprising: applying excitation power to a device under test; and introducing noise to the excitation power with a noise introduction apparatus interposed between a power source and device under test in operable communication with a voltage source by; establishing a low impedance conductive path when commanded with a switching device, and establishing a low impedance conductivity for a selected current and a selected duration with a current limiting device in series with the switching device. The switching device and current limiting device cooperate to shunt the voltage source to the excitation power applied to the device under test.

Also disclosed herein in another exemplary embodiment is a system for testing noise susceptibility of a device under test comprising: a means for applying excitation power to a device under test; and a means for introducing noise to the excitation power with a noise introduction apparatus interposed between a power source and the device under test in operable communication with a voltage source including; a means for establishing a low impedance conductive path when commanded with a switching device, and a means for establishing a low impedance conductivity for a selected current and a selected duration with a current limiting device in series with the switching device. The switching device and current limiting device cooperate to shunt said voltage source to the excitation power applied to the device under test.

BRIEF DESCRIPTION OF THE DRAWINGS

These and other objects and advantages of the present invention may be best understood by reading the accompanying detailed description of the exemplary embodiments while referring to the accompanying figures wherein like elements are numbered alike in the several figures in which.

The detailed description explains the preferred embodiments of our invention, together with advantages and features, by way of example with reference to the drawings.

DETAILED DESCRIPTION OF THE EXEMPLARY EMBODIMENTS

Figure 1:
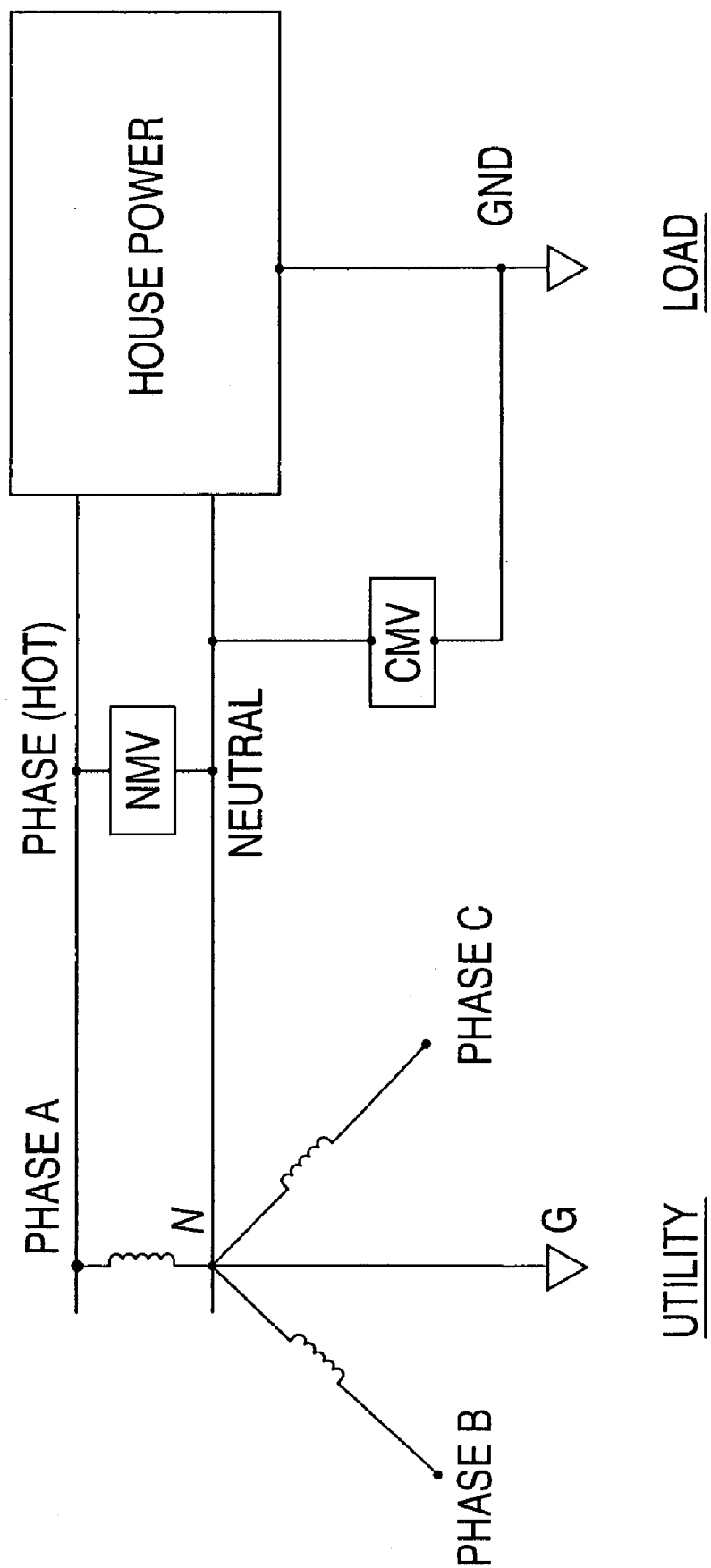
FIG. 1 is a simplified block diagram depicting connection of a power source and measurement of normal and common mode voltages for a system.

Referring to FIG. 1, a connection of a system or device to a power system is depicted where the equipment being tested for common mode noise anomalies is connected to a source of power. The normal mode voltage and common mode voltage are depicted. It will be appreciated that a single phase of a three phase power source is depicted as connected for simplicity. However, the exemplary embodiments described herein are readily applicable to Direct Current (DC) single phase alternating current (AC), or multiphase power systems.

Figure 2:
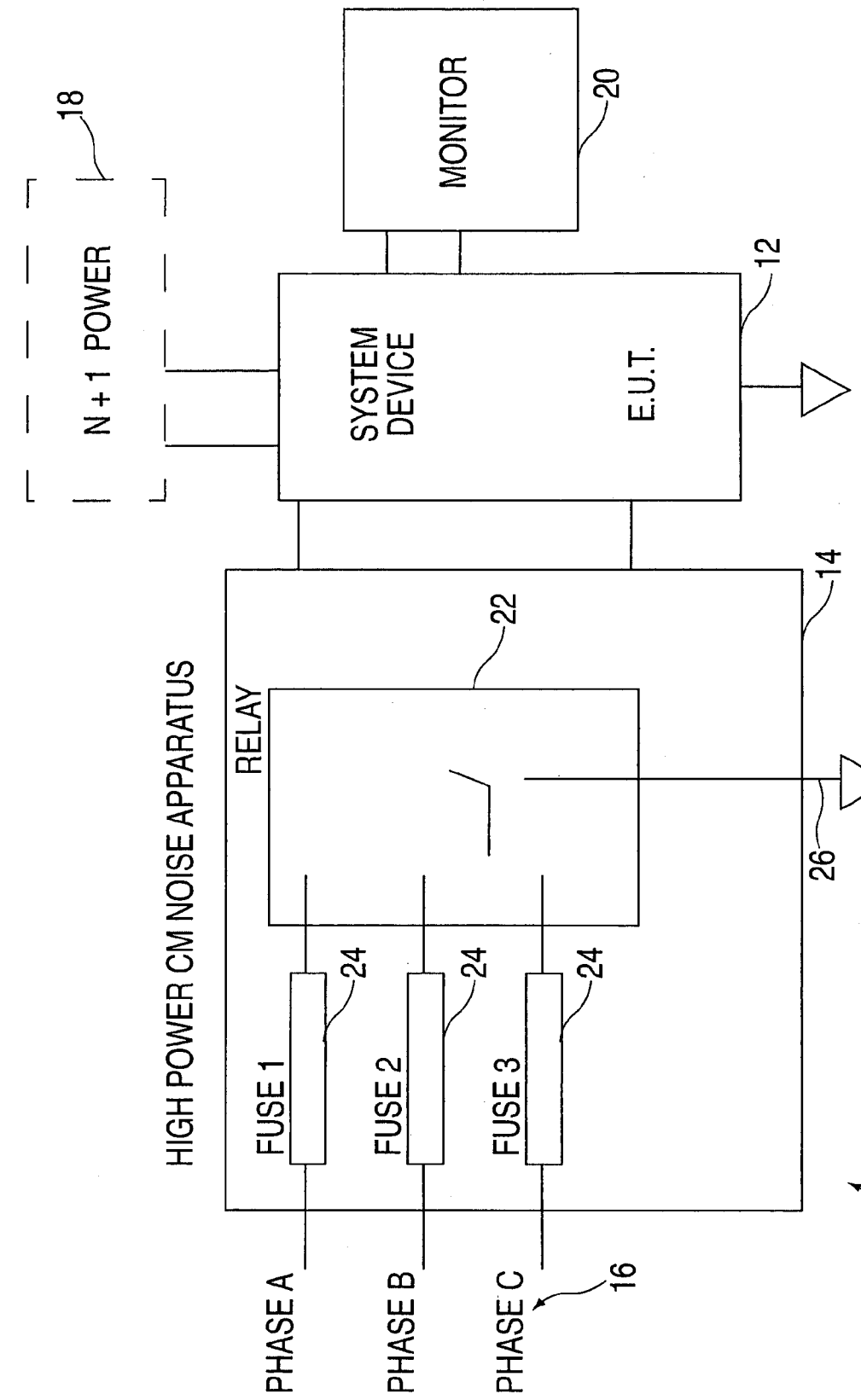
FIG. 2 is a simplified block diagram for implementation of the system and methodology in accordance with an exemplary embodiment.

Turning now to FIG. 2, a simplified block diagram depicting an exemplary embodiment of a testing system 10 is provided. In an exemplary embodiment, a system device 12 to be tested receives its excitation power from noise introduction apparatus 14, connected to a power source 16 and configured to inject high power CM noise. In an exemplary embodiment, the system device 12, includes a computer sysplex including, but not limited to, a plurality of processing complexes and coupling facilities. It will be appreciated that the exemplary embodiments are readily applicable to various devices for testing whether of larger scale or smaller scale than a computer sysplex as described. The system device 10 may be interfaced with redundant power supply 18 for maintaining operation in some embodiments, as well as a monitoring device 20 for observation of responses to the CM noise injection. The monitoring device 20 may include any signal generating means, computers, processors, storage and the like as needed to facilitate capture and analysis of the voltages and responses of the equipment under test, e.g., system device 12 as needed.

Continuing with FIG. 2, the power supplied from power source 16 is routed through the noise introduction apparatus 14 and the applied to the system device 12. In an exemplary embodiment a three-phase power supply is depicted. The noise introduction apparatus 14 injects high power CM noise to the power supplied to the system device 12 such that the energy and duration of the injected noise is controlled and constrained. In an exemplary embodiment a switching device 22 provides a low impedance path to a voltage source 26 (e.g., in an embodiment, ground) e.g., a short for one or more phases of the power source 16, directly shunting the power from the power source 16 for each phase to the voltage source 26 (ground). The switching device 22 may include, but not be limited to a relay, solid-state relay, transistor, MOSFET, and the like, as well as combinations including at least one of the foregoing. Of course, such a short results in a large current spike as the energy in the power source 16 is shunted to the voltage source 26 (ground).

A current limiting device 24 placed in series with each phase of the power source 16, which limits the shunted current to a selected level for a selected duration. In an exemplary embodiment a 50 ampere (A), 8 millisecond (ins) semiconductor fuse is employed for the current limiting device 24, however additional current values and time ratings may readily be employed based on the implementation and configuration of the power source 16, noise introduction apparatus 14, and system device 12. Thereby, a high power CM noise pulse is introduced to the system device 12 under test to facilitate evaluation of the susceptibility of the system device 12. In the exemplary embodiment depicted, the current limiting device 24 opens following the selected duration when the current has exceeded the maximum specified for the selected current limiting device 24. It will be appreciated that in an exemplary embodiment, preferably, the switching device 24 is controlled by the monitoring device 20 to facilitate the injection of the high power CM noise and the monitoring of the response of the system device 12.

Figure 3:
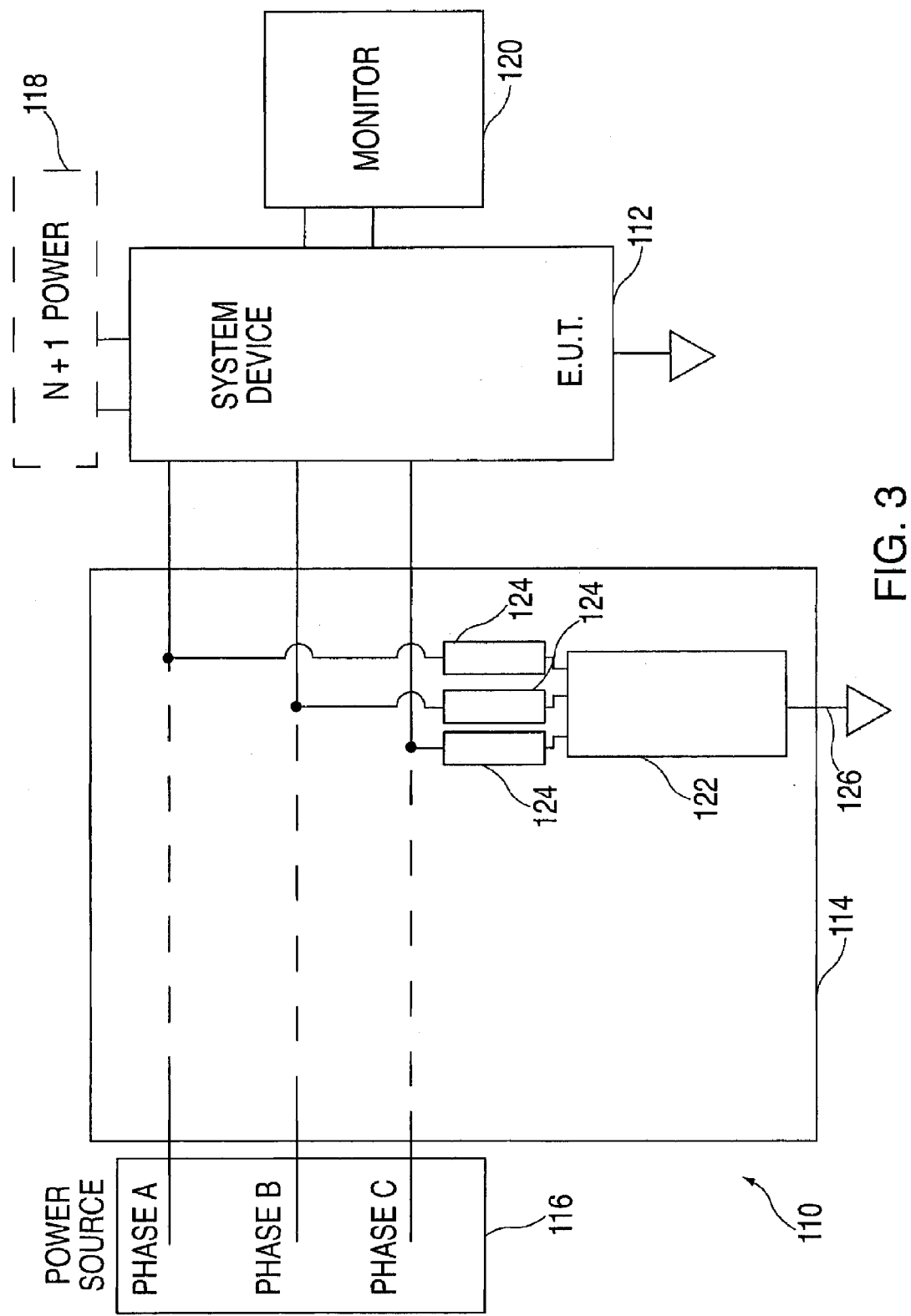
FIG. 3 is a simplified block diagram for implementation of the system and methodology in accordance with another exemplary embodiment.

Turning now to FIG. 3, a simplified block diagram in accordance with another exemplary embodiment of a testing system 110 is provided is depicted, wherein similar components are indicated with the respective reference numerals incremented by 100 from those in FIG. 2. In this exemplary embodiment, the power supplied from power source 116 is routed through the noise introduction apparatus 114 and the applied to the system device 112. In this exemplary embodiment switching device 122 provides a low impedance path to a voltage source 126 (e.g., in an embodiment, ground), e.g., a short for one or more phases of the power source 116, directly shunting the power for each phase to the voltage source 126 (ground). Of course, once again, such a short results in a large current spike as the energy in the power source 116 is shunted to the voltage source 126 (ground).

The switching device 122 and current limiting device 124 may be arranged in series in series between the power source 116 and voltage source 126 (e.g., ground) and the power is also directed to the system device 112. In this embodiment, when the switching device 122 is activated, the current from the power source 116 is once again shunted through the current limiting device 124 and the switching device 122 to the voltage source 126 (ground). Thereby, a high power CM noise pulse is introduced to the system device 112 under test to facilitate evaluation of the susceptibility of the system device 112. Advantageously, with this embodiment, if desired, the power form the power source 116 supplied to the system device 112 is disturbed rather than completely interrupted.

As described above, the shunted current is maintained at a selected level for a selected duration. Again, in this exemplary embodiment a 50 ampere (A), 8 millisecond (ins) semiconductor fuse is employed for the current limiting device 124, however additional current values and time ratings may readily be employed based on the implementation and configuration of the power source 116, noise introduction apparatus 114, and system device 112. In the exemplary embodiment depicted, the current limiting device 124 opens following the selected duration when the current has exceeded the maximum specified for the selected current limiting device 124. Similarly, in an exemplary embodiment, preferably, the switching device 122 is controlled by the monitoring device 20 to facilitate the injection of the high power CM noise and the monitoring of the response of the system device 112.

Figure 4:
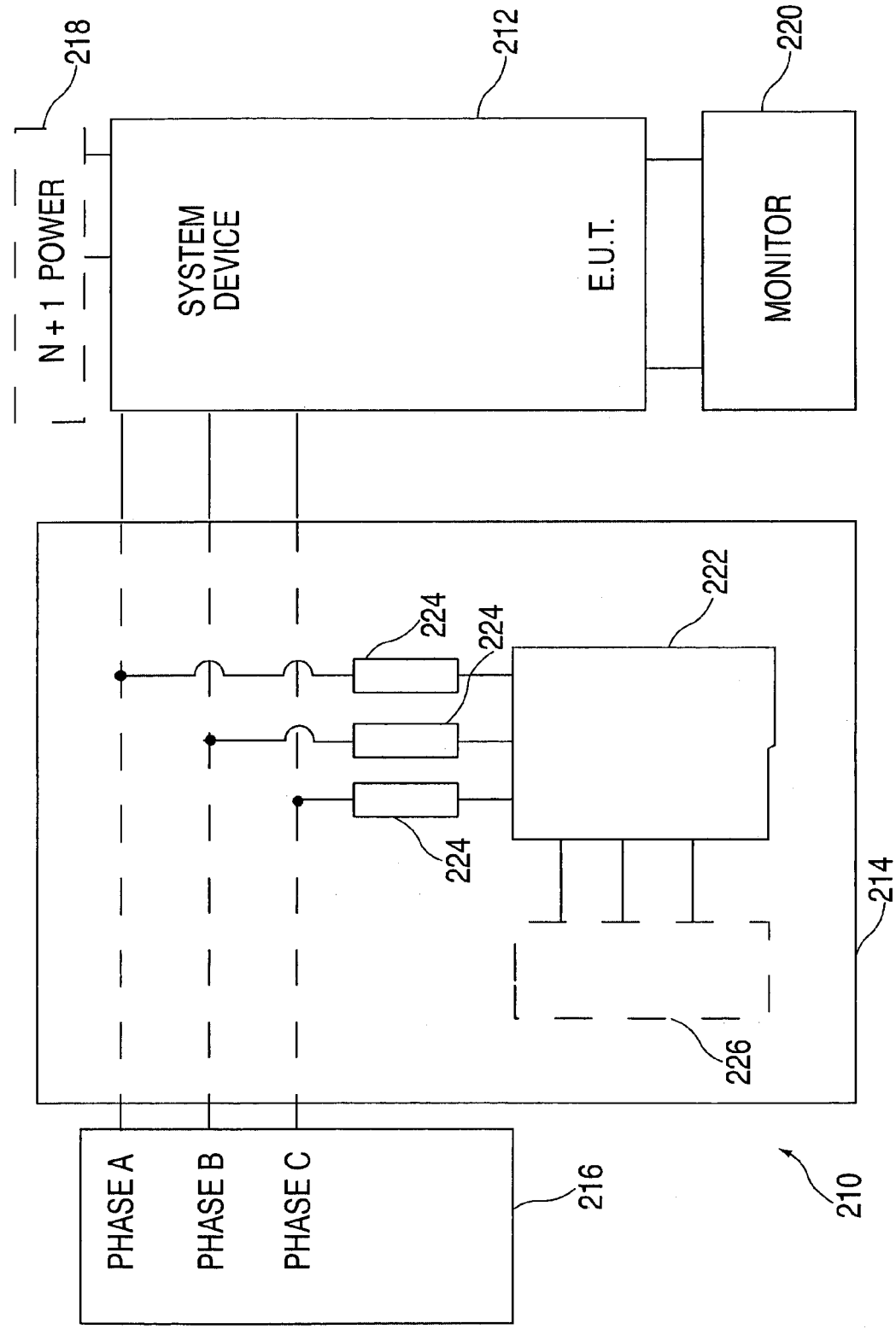
FIG. 4 is a simplified block diagram for implementation of the system and methodology in accordance with yet another exemplary embodiment.

Turning now to FIG. 4, a simplified block diagram of another exemplary embodiment of a testing system 210 is provided is provided, wherein similar components are indicated with the respective reference numerals incremented by 200 from those in FIG. 2. In this exemplary embodiment, the power supplied from power source 216 is routed through the noise introduction apparatus 214 and the applied to the system device 212. In this exemplary embodiment switching device 222 provides a low impedance path to another voltage source 226 e.g., a high voltage source 226, to short one or more phases of the power source 216, directly shunting the power for each phase to the high voltage source 226. In an exemplary embodiment the high voltage source is configured such that the voltage difference between the high voltage source 226 and the power source 216 is sufficiently large to introduce the desired common mode voltage to the system device 212. Of course, once again, such a short results in a large current spike as the energy in high voltage source is shunted to the system device 212.

Again, in this embodiment, the switching device 222 and current limiting device 224 may be arranged to in series such that two devices are in series between the voltage source 216 and ground and the power from the power source 216 is also directed to the system device 212. In this embodiment, when the switching device 222 is activated, the current from the high voltage power source 226 is once again shunted through the current limiting device 224 and the switching device 22 to the system device 212. Thereby, a high power CM noise pulse is introduced to the system device 212 under test to facilitate evaluation of the susceptibility of the system device 212. Advantageously, with this embodiment, if desired, the power supplied to the system device 212 is again disturbed rather than interrupted.

As described above, the shunted current is maintained at a selected level for a selected duration. In an exemplary embodiment a 50 ampere (A), 8 millisecond (ins) semiconductor fuse is employed for the current limiting device 224, however additional current values and time ratings may readily be employed based on the implementation and configuration of the power source 216, noise introduction apparatus 214, and system device 212. In the exemplary embodiment depicted, the current limiting device 224 opens following the selected duration when the current has exceeded the maximum specified for the selected current limiting device 24. Similarly, in an exemplary embodiment, preferably, the switching device 224 is controlled by the monitoring device 220 to facilitate the injection of the high power CM noise and the monitoring of the response of the system device 212.

It will be appreciated that the common mode error testing is performed with a clean power signal. However, the test can also be performed introducing normal mode noise signals along with the common mode noise on the power from the power source(s) 16, 116, 216 to check for failure conditions that may result from combinations of common mode and normal mode noise conditions. Furthermore, the tests can be run simultaneously with the testing of the processor driven by the power supply under test to detect computer error conditions resulting from common mode noise alone or in combination with normal mode noise.

Figure 5:
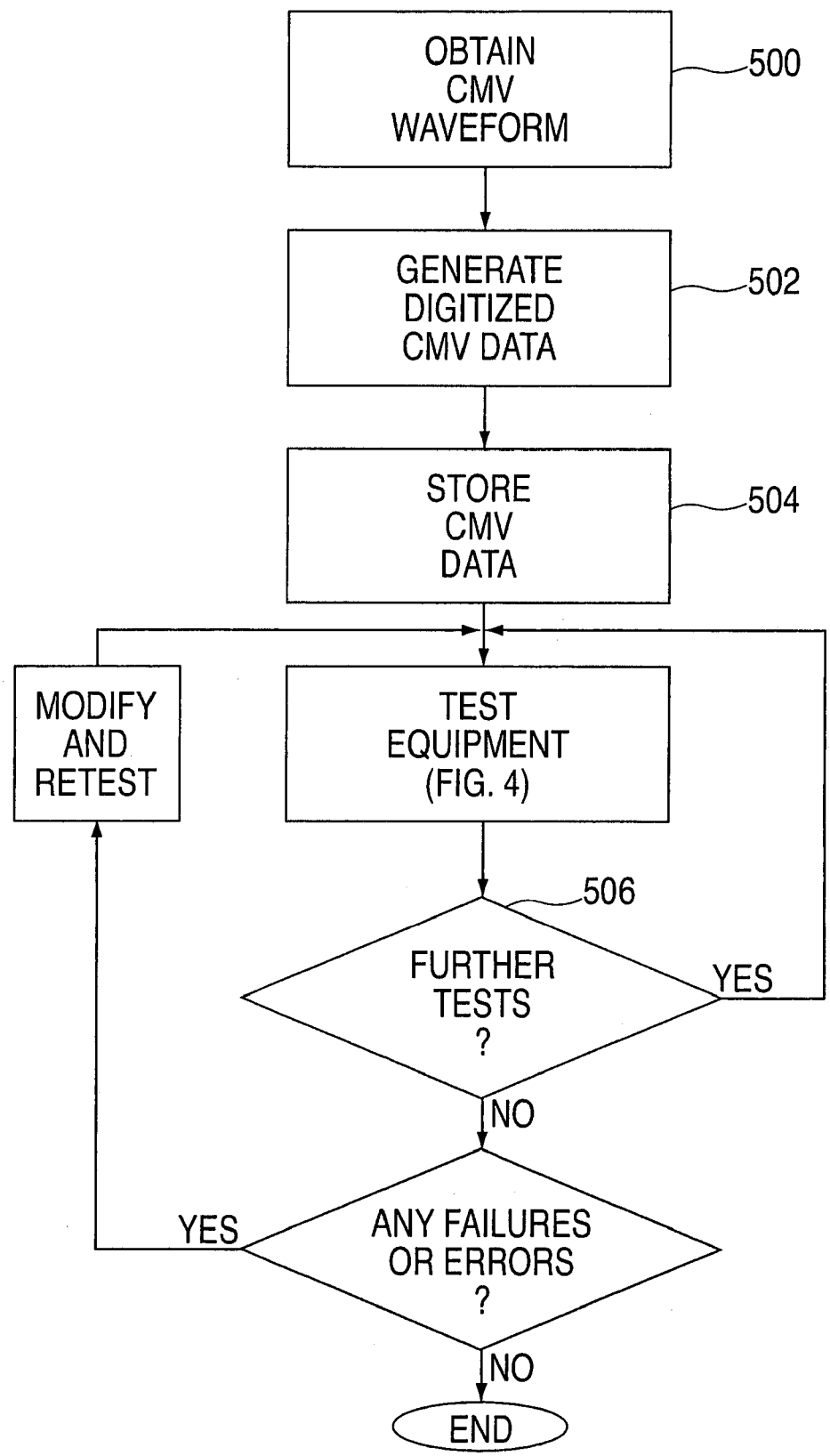
FIG. 5 is a flow chart depicting a methodology for testing equipment in accordance with an exemplary embodiment.

Referring to FIG. 5, the process of common mode noise testing can include obtaining common mode voltage waveforms 500 by recording common mode voltages and/or normal mode voltages; particularly, neutral to ground voltages and phase to ground voltages occurring during malfunctioning of the equipment under field conditions. The waveforms are optionally reduced to digital data 502 and the data is placed in storage 504 for use with the test systems of FIGS. 2-4. The systems 10, 110, 210 are evaluated through a sequence 506 of the captured noise conditions. These tests can be performed in isolation; simultaneously with normal mode noise tests of the power supply; and/or overall testing of the computer equipment.

The disclosed invention can be embodied in the form of computer, controller, or processor implemented processes and apparatuses for practicing those processes. The present invention can also be embodied in the form of computer program code containing instructions embodied in tangible media, such as floppy diskettes, CD-ROMs, hard drives, or any other computer-readable storage medium, wherein, when the computer program code is loaded into and executed by a computer, controller, or processor, the computer, controller, or processor becomes an apparatus for practicing the invention. The present invention may also be embodied in the form of computer program code as a data signal, for example, whether stored in a storage medium, loaded into and/or executed by a computer, controller, or processor, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose processor, the computer program code segments configure the processor to create specific logic circuits.

It will be appreciated that the use of first and second or other similar nomenclature for denoting similar items is not intended to specify or imply any particular order unless otherwise stated.

While the invention has been described with reference to an exemplary embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A system for injecting noise signals onto power generated by a power source comprising:

a voltage source;

a device under test having a power input in communication with a noise introduction apparatus;

said noise introduction apparatus interposed between the power source and device under test in communication with said voltage source, the noise introduction apparatus comprising;

a switching device configured to provide a low impedance conductive path when commanded, and a current limiting device in series with said switching device, said current limiting device configured to provide a low impedance conductivity for a selected current and a selected duration;

wherein said switching device and current limiting device cooperate to shunt said voltage source to said power input so as to selectively generate a current spike sufficient to facilitate evaluation of the susceptibility of the device under test to common mode noise, the device under test comprising computer sysplex including a plurality of processing complexes and coupling facilities.

2. The system of claim 1 further including monitoring equipment in communication with said device under test to facilitate identification of fault incidents based on the power including said noise.

3. The system of claim 1 further including said monitoring equipment in communication with said switching device to facilitate identification of fault incidents based on the power including said noise.

4. The system of claim 1 further including another power source for maintaining power operation of said device under test in instances when said noise reduction apparatus interrupts power from said power source.

5. The system of claim 1 wherein the power source includes at least one of direct current, alternating current, and multiphase alternating current.

6. The system of claim 1 wherein said current limiting device comprises a semiconductor fuse.

7. A system for testing noise susceptibility of a device under test comprising: a means for applying excitation power to a device under test;
   a means for introducing noise to said excitation power with a noise introduction apparatus interposed between a power source and the device under test in communication with a voltage source including;
   a means for establishing a low impedance conductive path when commanded with a switching device, and
   a means for establishing a low impedance conductivity for a selected current and a selected duration with a current limiting device in series with said switching device; and
   wherein said switching device and current limiting device cooperate to shunt said voltage source to said excitation power applied to the device under test so as to selectively generate a current spike sufficient to facilitate evaluation of the susceptibility of the device under test to common mode noise, the device under test comprising computer sysplex including a plurality of processing complexes and coupling facilities.

8. A method for testing noise susceptibility of a device under test comprising:
   applying excitation power to a device under test;
   introducing noise to said excitation power with a noise introduction apparatus interposed between a power source and the device under test in communication with a voltage source by;
   establishing a low impedance conductive path when commanded with a switching device, and
   establishing a low impedance conductivity for a selected current and a selected duration with a current limiting device in series with said switching device; and
   wherein said switching device and current limiting device cooperate to shunt said voltage source to said excitation power applied to the device under test so as to selectively generate a current spike sufficient to facilitate evaluation of the susceptibility of the device under test to common mode noise, the device under test comprising computer sysplex including a plurality of processing complexes and coupling facilities.

9. The method of claim 8 further including monitoring operation of said device under test to facilitate identification of fault incidents based on said excitation power including said noise.

10. The method of claim 8 further including controlling said switching device to facilitate identification of fault incidents based on said excitation power including said noise with monitoring equipment in communication therewith.

11. The method of claim 8 further including maintaining power operation of said device under test in instances when said noise reduction apparatus interrupts power from said power source.

12. The method of claim 8 wherein said excitation power includes at least one of direct current, alternating current, and multiphase alternating current.

13. The method of claim 8 wherein said current limiting device comprises a semiconductor fuse.

14. The method of claim 8 wherein said introducing is performed without introducing normal mode noise signals.

15. The method of claim 8, including recording said excitation power and noise to facilitate monitoring operation of said device under test.

* * * * *